United States Patent
Lee et al.

(10) Patent No.: US 7,248,517 B2
(45) Date of Patent: Jul. 24, 2007

(54) SEMICONDUCTOR MEMORY DEVICE HAVING LOCAL DATA LINE PAIR WITH DELAYED PRECHARGE VOLTAGE APPLICATION POINT

(75) Inventors: Hi-Choon Lee, Yongin-si (KR); Jin-Hyung Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 11/128,878

(22) Filed: May 14, 2005

(65) Prior Publication Data
US 2006/0120182 A1 Jun. 8, 2006

(30) Foreign Application Priority Data
Dec. 8, 2004 (KR) ...................... 10-2004-0103008

(51) Int. Cl.
*G11C 7/00* (2006.01)
(52) U.S. Cl. .................. 365/203; 365/205; 365/63
(58) Field of Classification Search ............... 365/203, 365/205, 63
See application file for complete search history.

(56) References Cited

U.S. PATENT DOCUMENTS 5,978,286 A 11/1999 Chang et al.
6,741,511 B2 * 5/2004 Nakao ........................ 365/201
6,798,704 B2 * 9/2004 Chen et al. .................. 365/203

FOREIGN PATENT DOCUMENTS

| JP | 01084776 | 3/2001 |
|----|----------|--------|
| KR | 100377169 | 3/2003 |

OTHER PUBLICATIONS

English Abstract**.

* cited by examiner

*Primary Examiner*—Huan Hoang
(74) *Attorney, Agent, or Firm*—F. Chau & Associates, LLC

(57) ABSTRACT

Disclosed herein is a semiconductor memory device having a pair of local data lines with a delayed precharge voltage application point. The semiconductor memory device of the present invention includes a delay block for delaying the activation time of a block write control signal, thus lengthening the interval starting from the time when data on a pair of bit lines are amplified to the time when a supply voltage is applied to a pair of local data lines. Therefore, according to the semiconductor memory device of the present invention, the time when the supply voltage is applied to the pair of local data lines is the time after data have sufficiently stabilized on the pair of bit lines. Therefore, the semiconductor memory device of the present invention prevents the stabilization speed of the pair of bit lines and the pair of local data lines from decreasing, thus consequently improving the operating speed of the semiconductor memory device.

11 Claims, 4 Drawing Sheets

SEMICONDUCTOR MEMORY DEVICE HAVING LOCAL DATA LINE PAIR WITH DELAYED PRECHARGE VOLTAGE APPLICATION POINT

BACKGROUND OF THE INVENTION

This application claims the priority of Korean Patent Application No. 10-2004-0103008, filed on Dec. 8, 2004, in the Korean Intellectual Property Office, the disclosure of which is incorporated herein in its entirety by reference.

FIELD OF THE INVENTION

The present invention relates, in general, to a semiconductor memory device and, more particularly, to a semiconductor memory device, that reads out data stored in a selected memory cell through hierarchical data line pairs.

DESCRIPTION OF THE RELATED ART

Generally, semiconductor memory devices, including Dynamic Random Access Memory (DRAM), output data stored in a selected memory cell to the outside of the memory device through data line pairs. The data value in the data line is identified by a difference between the voltages of the two data lines forming each pair. In this case, the voltage difference between the two data lines forming each pair can decrease while passing through long data buses. The voltage difference in the data line pair is amplified by a sense amplifier, so that the voltage difference is identified as logic H data or logic L data.

FIG. 1 is a circuit diagram showing hierarchical data line pairs in a conventional semiconductor memory device 100. FIG. 2 is a timing diagram showing signals at various nodes of the semiconductor memory device 100. First, when an active command ACT is presented, data stored in a memory cell MC connected to an enabled word line WL is denoted by the voltage difference between a pair of bit lines BL and BLB. Further, if a sense enable signal PSE is activated to a logic H level, a Bit Line Sense Amplifier (BLSA) 110 generates the voltage difference between the pair of bit lines BL and BLB. In this case, a first precharge signal LAEQ is disabled to logic L, and a pair of local data lines LI0 and LI0B, precharged to a bit line voltage VBL, is released from a precharge state. In this case, the bit line voltage VBL is about half of the supply voltage VCC. Further, if a block selection signal PBLSi for selecting a memory block (not shown) including the selected memory cell MC is activated, a global connection control signal PWBLK is activated, so that the pair of local data lines LI0 and LI0B is electrically connected to a pair of global data lines GI0 and GI0B precharged to the supply voltage VCC. Therefore, the supply voltage VCC is applied to the pair of local data lines LI0 and LI0B.

By applying the supply voltage VCC to the pair of local data lines LI0 and LI0B, the data on the pair of local data lines LI0 and LI0B can be stabilized after data on the pair of bit lines BL and BLB is stabilized to some degree.

Next, if a read command RD is presented, the pair of bit lines BL and BLB shares charges with the pair of local data lines LI0 and LI0B in response to a column selection signal (CSL). At this time, a second precharge signal IOPREB is disabled to a logic H level, and the pair of global data lines GI0 and GI0B, which were precharged to the supply voltage VCC, is released from a precharge state.

In the conventional semiconductor memory device 100 of FIG. 1, the global connection control signal PWBLK is the signal obtained by buffering a block selection signal PBLSi that is enabled nearly simultaneously with the sense enable signal PSE. Therefore, in an operation mode when tRCD is short, the global connection control signal PWBLK is enabled before data is sufficiently stabilized on the pair of bit lines BL and BLB. Further, NMOS transistors 131 and 133 of a global connection switch pair 130 for connecting the pair of local data lines LI0 and LI0B with the pair of global data lines GI0 and GI0B are turned on. Then, the voltage level of the pair of local data lines LI0 and LI0B is close to a voltage VCC-Vt. Here, Vt shows the threshold voltage of the NMOS transistors 131 and 133.

Consequently, when the pair of bit lines BL and BLB and the pair of local data lines LI0 and LI0B share charges (in a short tRCD operation, data do not sufficiently stabilize on the pair of bit lines BL and BLB), the voltage of the pair of local data lines LI0 and LI0B becomes higher than the precharge voltage of the pair of bit lines BL and BLB. In this case, the average voltage of the bit lines BL and BLB also becomes higher than the bit line voltage VBL, thus weakening the driving capability of the bit line sense amplifier (BLSA) 110.

Therefore, in the conventional semiconductor memory device 100 of FIG. 1, the stabilization speed of the pair of bit lines BL and BLB and the pair of local data lines LI0 and LI0B decreases, thus consequently decreasing the operating speed of the semiconductor memory device.

SUMMARY OF THE INVENTION

A semiconductor memory device is provided, which prevents the stabilization speed of a pair of bit lines and a pair of local data lines from decreasing, thus consequently increasing the operating speed of the semiconductor memory device.

In accordance with an aspect of the present invention, there is provided a semiconductor memory device. The semiconductor memory device of the present invention includes a pair of bit lines, a bit line sense amplifier, a pair of local data lines, a column selection switch pair, a first precharge unit, a second precharge unit, and a delay block. The pair of bit lines reflects data stored in a selected memory cell. The bit line sense amplifier senses and amplifies data loaded on the pair of bit lines in response to a predetermined sense enable signal. The column selection switch pair connects the pair of bit lines to the pair of local data lines in response to a predetermined column selection signal. The first precharge unit precharges the pair of local data lines to a first precharge voltage. The second precharge unit precharges the pair of global data lines to a second precharge voltage. The delay block increases an interval starting from a time when the data loaded on the pair of bit lines is amplified to a time when the second precharge voltage is applied to the pair of local data lines.

DESCRIPTION OF THE PREFERRED EMBODIMENTS

Figure 1:
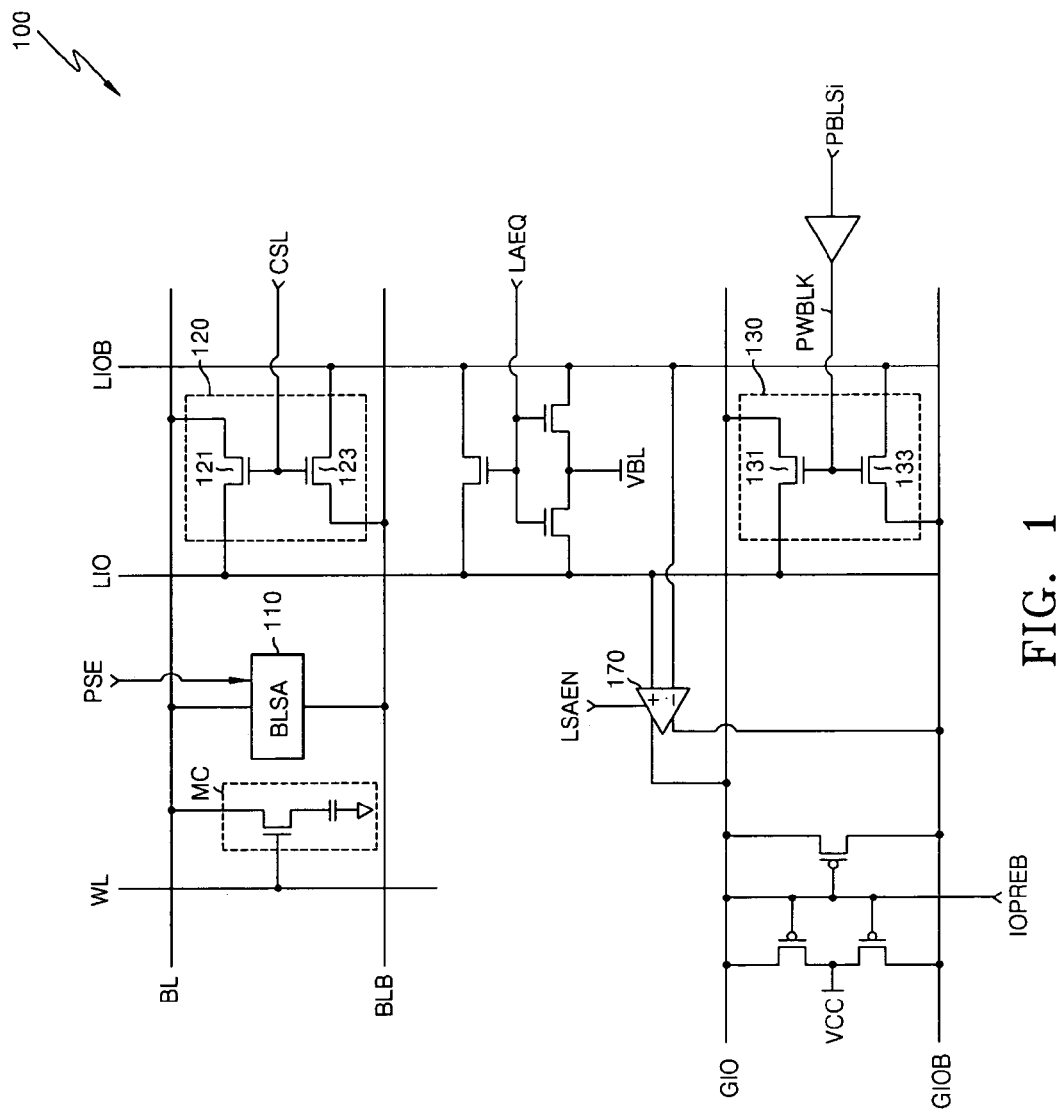
FIG. 1 is a circuit diagram showing hierarchical data line pairs in a conventional semiconductor memory device.
Figure 2:
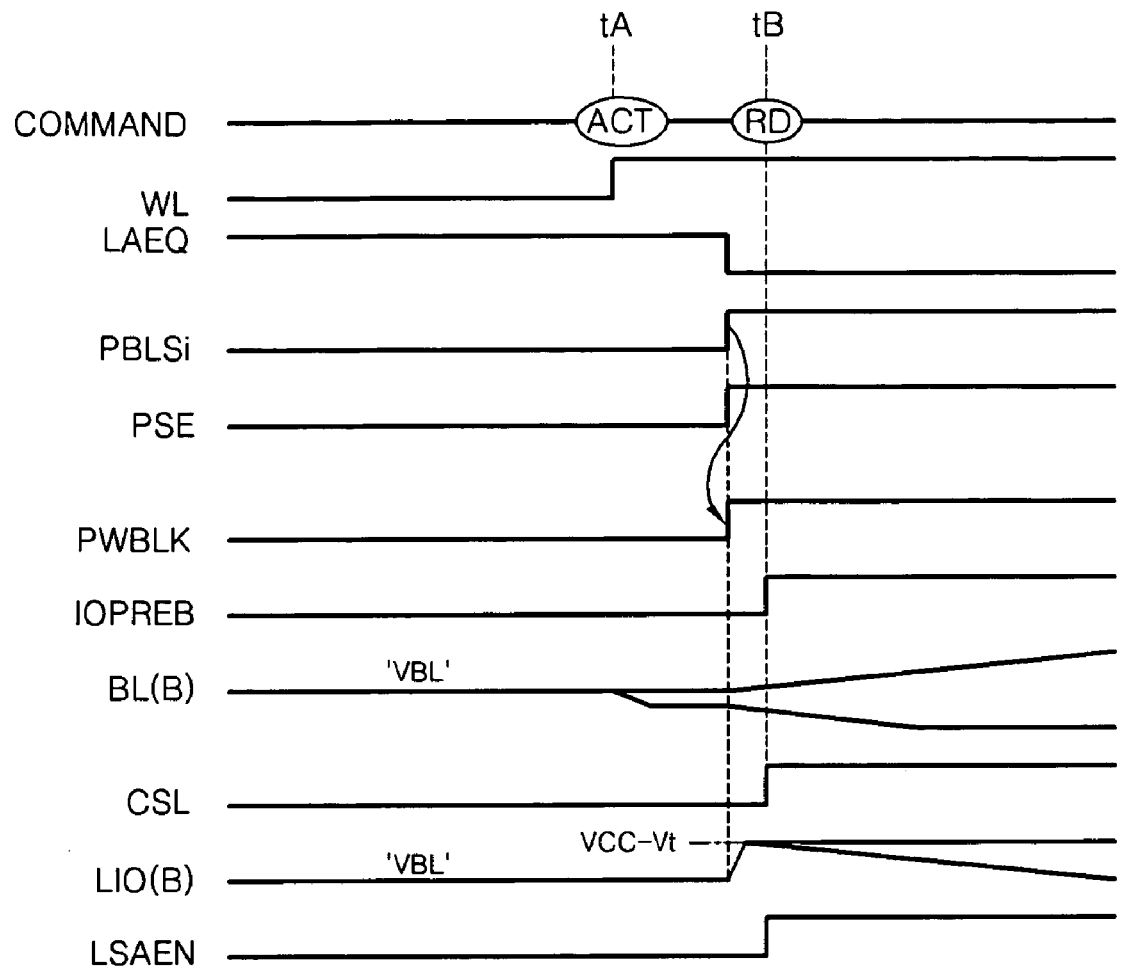
FIG. 2 is a timing diagram showing signals at various nodes of the semiconductor memory device of FIG. 1.

The features of the present invention will be more clearly understood from the following detailed description taken in conjunction with the accompanying drawings. Reference should be made to the drawings, in which the same reference numerals are used throughout the different drawings to designate the same or similar components.

Hereinafter, embodiments of the present invention will be described in detail with reference to the attached drawings.

Figure 3:
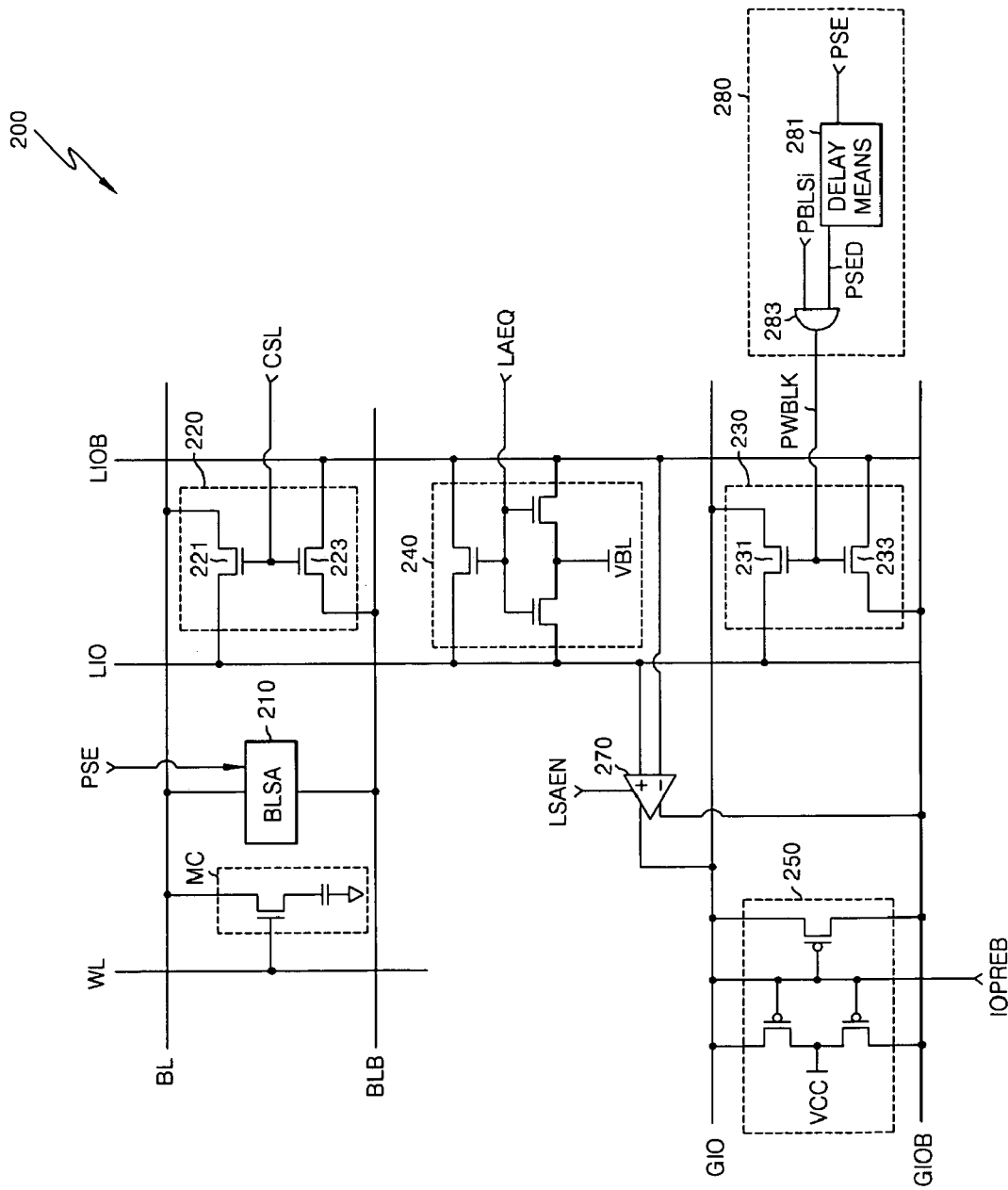
FIG. 3 is a view showing a semiconductor memory device according to an embodiment of the present invention.

FIG. 3 is a view showing a semiconductor memory device 200 according to an embodiment of the present invention. Referring to FIG. 3, the semiconductor memory device 200 of the present invention includes a pair of bit lines BL and BLB, a Bit Line Sense Amplifier (BLSA) 210, a pair of local data lines LI0 and LI0B, a column selection switch pair 220, a first precharge unit 240 and a second precharge unit 250. Further, the semiconductor memory device 200 includes a delay block 280. Preferably, the semiconductor memory device 200 further includes a pair of global data lines GI0 and GI0B and a global connection switch pair 230. For reference in the present specification, the pair of bit lines BL and BLB is referred to as a "first data line pair", the pair of local data lines LI0 and LI0B is referred to as a "second data line pair", and the pair of global data lines GI0 and GI0B is referred to as a "third data line pair".

The pair of bit lines BL and BLB reflects data stored in a selected memory cell MC. The BLSA 210 senses and amplifies data loaded on the pair of bit lines BL and BLB when a sense enable signal PSE is enabled to a logic H level. In the present specification, the sense enable signal PSE is referred to as a "first control signal".

The column selection switch pair 220 electrically connects the pair of bit lines BL and BLB to the pair of local data lines LI0 and LI0B in response to a column selection signal CSL. Preferably, the column selection switch pair 220 includes NMOS transistors 221 and 223 gated with the column selection signal CSL. Therefore, if the column selection signal CSL is enabled to a logic H level, the pair of bit lines BL and BLB is electrically connected to the pair of local data lines LI0 and LI0B. In the present specification, the column selection switch pair 220 is referred to as a "first switch pair". Further, the column selection signal CSL is referred to as a "second control signal".

The global connection switch pair 230 electrically connects the pair of local data lines LI0 and LI0B to the pair of global data lines GI0 and GI0B in response to a block write control signal PWBLK. Preferably, the global connection switch pair 230 includes NMOS transistors 231 and 233 gated with the block write control signal PWBLK. Therefore, if the block write control signal PWBLK is enabled to a logic H level, the pair of local data lines LI0 and LI0B is electrically connected to the pair of global data lines GI0 and GI0B. In the present specification, the global connection switch pair 230 is referred to as a "second switch pair", and the block write control signal PWBLK is referred to as a "A third control signal".

The first precharge unit 240 precharges the pair of local data lines LI0 and LI0B to a first precharge voltage. Further, the second precharge unit 250 provides a second precharge voltage. In this embodiment, the second precharge unit 250 precharges the pair of global data lines GI0 and GI0B to the second precharge voltage. Preferably, the first precharge voltage is lower than the second precharge voltage. More preferably, the first precharge voltage is a bit line voltage VBL, which is about half of the supply voltage VCC and is equal to the precharge voltage of the pair of bit lines BL and BLB. Further, the second precharge voltage is the supply voltage VCC.

Further, if a first precharge signal LAEQ is disabled to a logic L level, the pair of local data lines LI0 and LI0B is released from a precharge state. Further, if a second precharge signal IOPREB is disabled to a logic H level, the pair of global data lines GI0 and GI0B is released from a precharge state.

The delay block 280 delays the point in time when the block write control signal PWBLK is to be enabled. Due to the delay of the activation time of the block write control signal PWBLK, an interval, starting from the time when data on the pair of bit lines BL and BLB is amplified to the time when the pair of local data lines LI0 and LI0B is electrically connected to the pair of global data lines GI0 and GI0B, is lengthened. In other words, due to the delay block 280, an interval starting from the time when the data on the pair of bit lines BL and BLB is amplified to the time when the second precharge voltage (in this embodiment, the supply voltage VCC) is applied to the pair of local data lines LI0 and LI0B, is lengthened.

According to a preferred embodiment, the delay block 280 includes a delay unit 281 and a logic unit 283. The delay unit 281 provides a delayed enable signal PSED. The delayed enable signal PSED is obtained by delaying the sense enable signal PSE with a predetermined delay time. The logic unit 283 is enabled in response to a block selection signal PBLSi, and adapted to provide the block write control signal PWBLK activated in response to the delayed enable signal PSED, which is the output signal of the delay unit 281. In this case, the block selection signal PBLSi is a signal used to select a memory block (not shown) corresponding to the pair of local data lines LI0 and LI0B. More preferably, the logic unit 283 is an AND gate for performing an AND operation on the block selection signal PBLSi and the delayed enable signal PSED, and for outputting AND operation results as the block write control signal PWBLK.

Figure 4:
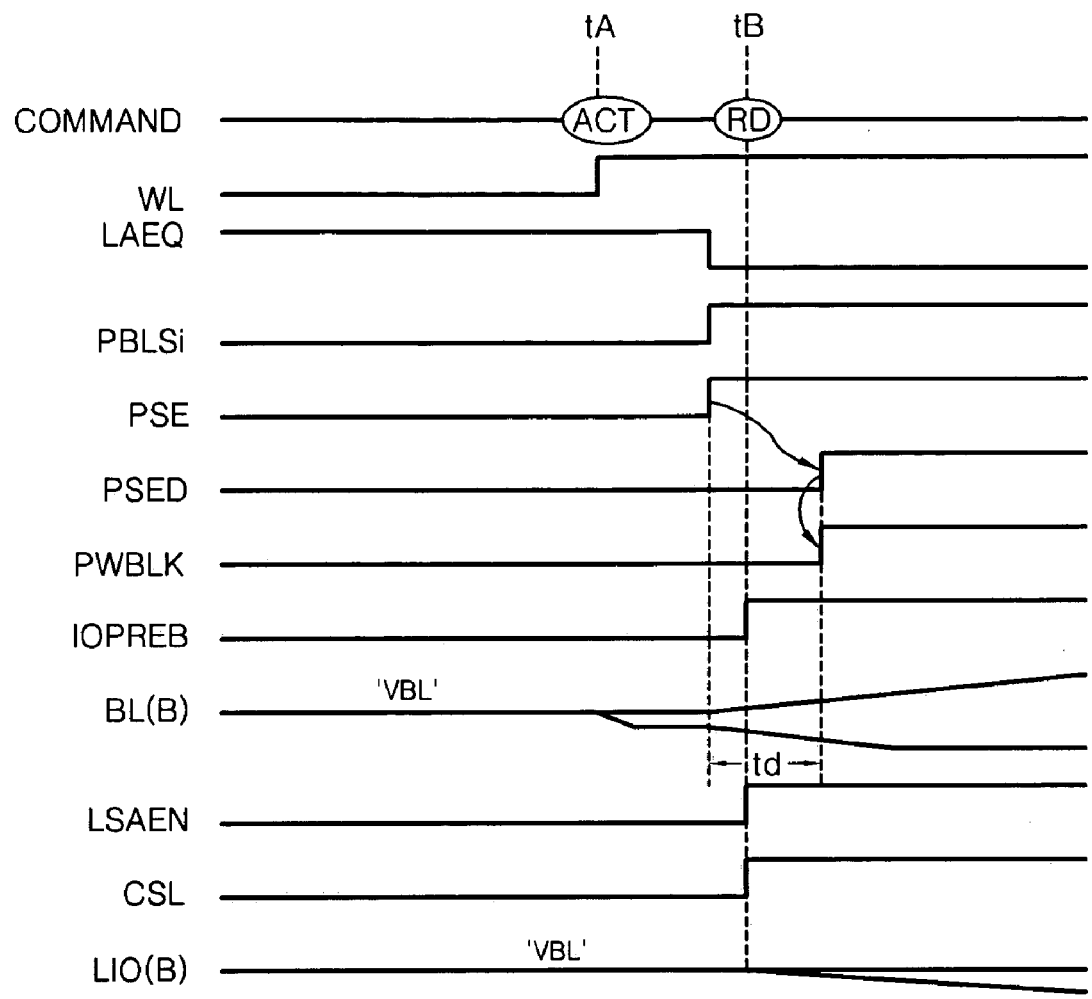
FIG. 4 is a timing diagram showing signals at various nodes of the semiconductor memory device of FIG. 3.

FIG. 4 is a timing diagram of the signals at various nodes of the semiconductor memory device 200 of FIG. 3, which shows the case where the semiconductor memory device 200 is operated in a short tRCD (the time period from the presentation of an active command to the presentation of a read command) mode. With reference to FIGS. 3 and 4, the operation of the semiconductor memory device 200 in a short tRCD mode is described.

First, if an active command ACT is presented at time tA, the word line WL of a selected memory cell MC is activated to a logic H level. Then, the data stored in the selected memory cell MC is presented on the pair of bit lines BL and BLB in response to the activation of the word line WL.

After a certain time has elapsed, the first precharge signal LAEQ is deactivated to a logic L level, so that the pair of local data lines LI0 and LI0B is released from the precharge and equalization states. Further, the block selection signal PBLSi is activated from a logic L level to a logic H level. Further, the sense enable signal PSE is activated to enable the bit line sense amplifier (BLSA) 210. Then, the voltage difference between the bit lines BL and BLB is amplified by the BLSA 210.

Next, a read command RD is presented at time tB. Further, the column selection signal CSL is activated to a logic H level in response to the presentation of the read command RD. Further, the pair of bit lines BL and BLB and the pair of local data lines LI0 and LI0B share charges. At this time, since the block write control signal PWBLK is at a logic L level, that is, in a deactivation state, the pair of local data lines LI0 and LI0B is electrically isolated from the pair of global data lines GI0 and GI0B. Therefore, the voltage level of the pair of local data lines LI0 and LI0B is not yet influenced by the pair of global data lines GI0 and GI0B. That is, at the time when the column selection signal CSL is activated to a logic H level, the pair of local data lines LI0 and LI0B maintains the bit line voltage VBL, which is the second precharge voltage.

Then, after a predetermined delay time td has elapsed from the activation time of the sense enable signal PSE, the block write control signal PWBLK is activated to a logic H level. That is, at the time when the block write control signal PWBLK is activated to a logic "H" level, data sufficiently stabilize on the pair of bit lines BL and BLB and the pair of local data lines LI0 and LI0B. Therefore, the decrease in the stabilization speed of the bit lines BL and BLB barely occurs.

In this embodiment, a local sense amplifier enable signal LSAEN for driving a local sense amplifier 270 is activated to a logic H level at the point tB when the read command RD is presented. Further, the local sense amplifier 270 receives data loaded on the pair of local data lines LI0 and LI0B as input signals and presents the input signals on the pair of global data lines GI0 and GI0B.

Further, at time tB, the second precharge signal IOPREB is disabled to a logic H level, so that the pair of global data lines GI0 and GI0B is released from a precharge state.

Thus, in a conventional semiconductor memory device 100 of FIG. 1, the voltage of the pair of local data lines LI0 and LI0B is VCC-Vt at the time when the column selection signal CSL is activated. In the semiconductor memory device 200 of FIG. 3, the voltage of the pair of local data lines LI0 and LI0B maintains the bit line voltage VBL at the time when the column selection signal CSL is activated. The bit line voltage VBL is close to the average of the voltages of the bit lines BL and BLB. Therefore, the semiconductor memory device 200 can minimize a decrease in the stabilization speed of the pair of bit lines BL and BLB due to the pair of local data lines LI0 and LI0B, thus consequently improving the operating speed of the semiconductor memory device.

In the meantime, when the semiconductor memory device 200 of the present invention is operated in a long tRC mode, data is sufficiently stabilized on the pair of bit lines BL and BLB before the column selection signal CSL is activated to a logic H level. Therefore, even though the block write control signal PWBLK is activated to a logic H level before the column selection signal CSL is activated to a logic H level, a decrease in the stabilization speed of the pair of bit lines BL and BLB barely occurs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, in the present specification, an embodiment in which a second precharge voltage is provided through a pair of global data lines is shown and described. However, those skilled in the art will appreciate that the technical spirit of the present invention can be applied to an embodiment in which the second precharge voltage is directly applied to the pair of local data lines.

As described above for at least one embodiment of the present invention, a semiconductor memory device includes a delay block for delaying the activation time of a block write control signal, thus lengthening an interval ranging from the time when data on a pair of bit lines are amplified to the time when a second precharge voltage is applied to a pair of local data lines. Therefore, the time when a supply voltage is applied to the pair of local data lines is the time after data have sufficiently stabilized on the pair of bit lines.

Accordingly, the present invention can prevent the stabilization speed of the pair of bit lines BL and BLB and the pair of local data lines LI0 and LI0B from decreasing, thus consequently improving the operating speed of the semiconductor memory device.

What is claimed is:

1. A semiconductor memory device, comprising:
    a pair of bit lines for presenting data stored in a selected memory cell;
    a bit line sense amplifier for sensing and amplifying data loaded on the pair of bit lines in response to a predetermined sense enable signal;
    a pair of local data lines;
    a column selection switch pair for connecting the pair of bit lines to the pair of local data lines in response to a predetermined column selection signal;
    a first precharge unit for precharging the pair of local data lines to a first precharge voltage;
    a second precharge unit for providing a second precharge voltage; and
    a delay for lengthening an interval ranging from a time when the data loaded on the pair of bit lines is amplified to a time when the second precharge voltage is applied to the pair of local data lines.

2. The semiconductor memory device according to claim 1, wherein the column selection switch pair comprises a pair of NMOS transistors gated in response to the column selection signal to connect the pair of bit lines to the pair of local data lines, and the first precharge voltage is lower than the second precharge voltage.

3. The semiconductor memory device according to claim 2, wherein:
    the second precharge voltage is a supply voltage, and
    the first precharge voltage is half of the supply voltage.

4. A semiconductor memory device, comprising:
    a pair of first data lines;
    a first data line sense amplifier for sensing and amplifying data loaded on the pair of first data lines in response to a predetermined first control signal;
    a pair of second data lines;
    a first switch pair for connecting the pair of first data lines to the pair of second data lines in response to a predetermined second control signal;
    a first precharge unit for precharging the pair of second data lines to a first precharge voltage;
    a second precharge unit for providing a second precharge voltage; and
    a delay block for increasing an interval ranging from a time when the data loaded on the pair of first data lines is amplified to a time when the second precharge voltage is applied to the pair of second data lines.

5. The semiconductor memory device according to claim 4, wherein:
    the first switch pair comprises a pair of NMOS transistors gated in response to the second control signal to connect the pair of first data lines to the pair of second data lines, and
    the first precharge voltage is lower than the second precharge voltage.

6. The semiconductor memory device according to claim 5, wherein:
    the second precharge voltage is a supply voltage, and
    the first precharge voltage is half of the supply voltage.

7. A semiconductor memory device, comprising:
a pair of bit lines for presenting data stored in a selected memory cell; a bit line sense amplifier for sensing and amplifying data loaded on the pair of bit lines in response to a predetermined sense enable signal;
a pair of local data lines;
a column selection switch pair for connecting the pair of bit lines to the pair of local data lines in response to a predetermined column selection signal;
a pair of global data lines;
a global connection switch pair for electrically connecting the pair of local data lines to the pair of global data lines in response to a predetermined block write control signal;
a first precharge unit for precharging the pair of local data lines to a first precharge voltage;
a second precharge unit for precharging the pair of global data lines to a second precharge voltage; and
a delay block for delaying an activation time of the block write control signal to increase an interval ranging from a time when the data loaded on the pair of bit lines is amplified to a time when the second precharge voltage is applied to the pair of local data lines.

8. The semiconductor memory device according to claim 7, wherein the delay block comprises:
a delay unit for providing a signal delayed from the sense enable signal by a predetermined delay time; and
a logic unit enabled in response to a predetermined block selection signal and adapted to provide the block write control signal activated in response to the signal output from the delay unit, the block selection signal being used to select a block corresponding to the pair of local data lines.

9. The semiconductor memory device according to claim 8, wherein:
the column selection switch pair comprises a pair of NMOS transistors gated in response to the column selection signal to connect the pair of bit lines to the pair of local data lines, and
the first precharge voltage is lower than the second precharge voltage.

10. The semiconductor memory device according to claim 9, wherein:
the second precharge voltage is a supply voltage, and
the first precharge voltage is half of the supply voltage.

11. The semiconductor memory device according to claim 7, wherein the column selection switch pair comprises:
a pair of NMOS transistors gated in response to the column selection signal to connect the pair of bit lines to the pair of local data lines, and
the first precharge voltage is lower than the second precharge voltage.

* * * * *